(12) United States Patent
Torimi et al.

(10) Patent No.: US 9,252,206 B2
(45) Date of Patent: *Feb. 2, 2016

(54) UNIT FOR LIQUID PHASE EPITAXIAL GROWTH OF MONOCRYSTALLINE SILICON CARBIDE, AND METHOD FOR LIQUID PHASE EPITAXIAL GROWTH OF MONOCRYSTALLINE SILICON CARBIDE

(75) Inventors: Satoshi Torimi, Kanonji (JP); Satoru Nogami, Kanonji (JP); Tsuyoshi Matsumoto, Kanonji (JP)

(73) Assignee: TOYO TANSO CO., LTD., Osaka-shi, Osaka (JP)

( * ) Notice: Subject to any disclaimer, the term of this patent is extended or adjusted under 35 U.S.C. 154(b) by 170 days.

This patent is subject to a terminal disclaimer.

(21) Appl. No.: 13/995,715

(22) PCT Filed: Jun. 29, 2011

(86) PCT No.: PCT/JP2011/064875
§ 371 (c)(1),
(2), (4) Date: Jun. 19, 2013

(87) PCT Pub. No.: WO2012/086237
PCT Pub. Date: Jun. 28, 2012

(65) Prior Publication Data
US 2013/0285060 A1 Oct. 31, 2013

(30) Foreign Application Priority Data

Dec. 24, 2010 (JP) ................................ 2010-288469
Dec. 24, 2010 (JP) ................................ 2010-288472
Dec. 24, 2010 (JP) ................................ 2010-288475
Dec. 24, 2010 (JP) ................................ 2010-288479

(51) Int. Cl.
*H01L 29/04* (2006.01)
*C30B 19/00* (2006.01)
(Continued)

(52) U.S. Cl.
CPC ................ *H01L 29/04* (2013.01); *C30B 19/00* (2013.01); *C30B 19/12* (2013.01); *C30B 29/36* (2013.01); *H01L 21/02598* (2013.01); *H01L 29/1608* (2013.01)

(58) Field of Classification Search
CPC ........................................................ H01L 29/04
USPC ............................................ 257/51; 438/478
See application file for complete search history.

(56) References Cited

U.S. PATENT DOCUMENTS 5,879,450 A 3/1999 Lee et al.
6,110,279 A * 8/2000 Kito et al. ...................... 117/105
(Continued)

FOREIGN PATENT DOCUMENTS

EP 0 967 304 A1 12/1999
EP 1 403 404 A1 3/2004
(Continued)

OTHER PUBLICATIONS

George et al (George) "Bias enhanced deposition of highly oriented β-SiC thin films using low pressure hot filament chemical vapour deposition technique", Thin Solid Films 419 (2002) p. 114-117.*
(Continued)

Primary Examiner — Jerome Jackson, Jr.
Assistant Examiner — Damian A Hillman
(74) Attorney, Agent, or Firm — Keating & Bennett, LLP (57) ABSTRACT

The cost of liquid phase epitaxial growth of a monocrystalline silicon carbide is reduced. A feed material 11 is such that when a surface layer thereof containing a polycrystalline silicon carbide with a 3C crystal polymorph is subjected to X-ray diffraction, a diffraction peak corresponding to a (111) crystal plane and a diffraction peak other than the diffraction peak corresponding to the (111) crystal plane are observed as diffraction peaks corresponding to the polycrystalline silicon carbide with a 3C crystal polymorph. A seed material 12 is such that when a surface layer thereof containing a polycrystalline silicon carbide with a 3C crystal polymorph is subjected to X-ray diffraction, a first-order diffraction peak corresponding to a (111) crystal plane is observed as a diffraction peak corresponding to the polycrystalline silicon carbide with a 3C crystal polymorph but no other first-order diffraction peak having a diffraction intensity of 10% or more of the diffraction intensity of the first-order diffraction peak corresponding to the (111) crystal plane is observed.

22 Claims, 7 Drawing Sheets

(51) Int. Cl.
    C30B 19/12      (2006.01)
    C30B 29/36      (2006.01)
    H01L 21/02      (2006.01)
    H01L 29/16      (2006.01)

(56) References Cited

U.S. PATENT DOCUMENTS

| | | | |
|---|---|---|---|
| 6,214,108 | B1 | 4/2001 | Okamoto et al. |
| 6,936,102 | B1 | 8/2005 | Otsuki et al. |
| 2004/0237879 | A1 | 12/2004 | Kaneko et al. |
| 2006/0011131 | A1* | 1/2006 | Otsuki et al. ............ 117/98 |
| 2009/0038538 | A1 | 2/2009 | Kaneko et al. |

FOREIGN PATENT DOCUMENTS

| | | |
|---|---|---|
| JP | 55-144499 A | 11/1980 |
| JP | 55-149195 A | 11/1980 |
| JP | 04-055397 A | 2/1992 |
| JP | 11-12096 A | 1/1999 |
| JP | 2000-044398 A | 2/2000 |
| JP | 2000-160343 A | 6/2000 |
| JP | 2001-107239 A | 4/2001 |
| JP | 2005-097040 A | 4/2005 |
| JP | 2008-016691 A | 1/2008 |
| JP | 2008-037684 A | 2/2008 |
| JP | 2008-230946 A | 10/2008 |
| JP | 2010-228937 A | 10/2010 |
| TW | I232891 B | 5/2005 |
| WO | 02/099169 A1 | 12/2002 |

OTHER PUBLICATIONS

Wang et al (Wang). "Microstructural analysis of single crystal SiC prepared by novel liquid phase epitaxy" Ceramics International 37 (2011) 3671-3676 pag.*

English translation of Official Communication issued in corresponding International Application PCT/JP2011/064875, mailed on Jul. 11, 2013.
Official Communication issued in International Patent Application No. PCT/JP2011/064875, mailed on Aug. 16, 2011.
Nishitani et al., "Metastable solvent epitaxy of SiC", Journal of Crystal Growth, vol. 310, 2008, pp. 1815-1818.
Steckl et al., "Characterization of 3C-SiC crystals grown by thermal decomposition of methyltrichlorosilane", Applied Physics Letters, vol. 69, No. 25, Dec. 16, 1996, pp. 3824-3826.
Official Communication issued in corresponding European Patent Application No. 11850694.8, mailed on Apr. 3, 2014.
Chichignoud et al., "High Temperature Processing of poly-SiC Substrates from the Vapor Phase for Wafer-Bonding," Surface & Coatings Technology, vol. 201, No. 7, Dec. 20, 2006, pp. 4014-4020.
Ohmukai et al., "Characteristics of Amorphous Silicon Precipitated by Means of Argon Excimer Laser Irradiation on SiC Films," Journal of Non-Crystalline Solids, vol. 202, No. 1-2, Jul. 1, 1996, pp. 77-80.
George et al., "Bias Enchanced Deposition of Highly Oriented β-Sic Thin Films Using Low Pressure Hot Filament Chemical Vapour Deposition Technique," Thin Solid Films, vol. 419, No. 1-2, Nov. 1, 2002, pp. 114-117.
Rimai et al., "Preparation of Oriented Silicon Carbide Films by Laser Ablation of Ceramic Silicon Carbide Targets," Applied Physics Letters, vol. 59, No. 18, Oct. 28, 1991, pp. 2266-2268.
Zheng et al., "Controlled-Growth and Characterization of 3C-SiC and 6H-SiC Films on C-plane Sapphire Substrates by LPCVD," Journal of Alloys and Compounds, vol. 426, No. 1-2, Dec. 21, 2006, pp. 290-294.
Hernández et al., "Study of Surface Defects on 3C-SiC Films Grown on Si(111) by CVD," Journal of Crystal Growth, vol. 253, No. 1-4, Jun. 1, 2003, pp. 95-101.
Official Communication issued in corresponding Taiwanese Patent Application No. 100125569, mailed on Aug. 11, 2015.
Nishitani, S. et al., "Simulations on Metastable Solvent Epitaxy of SiC", Proceedings of the Conference on Computational Engineering and Science, vol. 12, May 2007, 4 pages.

* cited by examiner

UNIT FOR LIQUID PHASE EPITAXIAL GROWTH OF MONOCRYSTALLINE SILICON CARBIDE, AND METHOD FOR LIQUID PHASE EPITAXIAL GROWTH OF MONOCRYSTALLINE SILICON CARBIDE

TECHNICAL FIELD

This invention relates to a unit for liquid phase epitaxial growth of a monocrystalline silicon carbide and a method for liquid phase epitaxial growth of a monocrystalline silicon carbide using the same.

BACKGROUND ART

Silicon carbide (SiC) is considered to be capable of achieving high-temperature resistance, high voltage resistance, high-frequency resistance, and high environment resistance each of which could not be achieved by conventional semiconductor materials, such as silicon (Si) and gallium arsenide (GaAs). Therefore, silicon carbide is expected as a semiconductor material for next-generation power devices and a semiconductor material for high-frequency devices.

The seeded sublimation growth method (modified Lely method) is conventionally proposed as a method for growing a monocrystalline silicon carbide, such as for example in Patent Literature 1 below. In this modified Lely method, a seed material made of a monocrystalline silicon carbide is placed in a low-temperature zone of a crucible and a powder of source material containing Si as a source material is placed in a high-temperature zone thereof. Then, the interior of the crucible is brought into an inert atmosphere and heated to a high temperature of 1450° C. to 2400° C. to sublimate the powder of source material placed in the high-temperature zone. As a result, silicon carbide can be epitaxially grown on the surface of the seed material placed in the low-temperature zone.

Nevertheless, the modified Lely method is a method of growing silicon carbide crystals by providing a temperature gradient in the gas phase. Therefore, in the case of using the modified Lely method, a large apparatus is required for epitaxial growth of silicon carbide and the process for epitaxial growth of silicon carbide is difficult to control. This presents a problem of rise in cost of producing a silicon carbide epitaxial growth film. In addition, epitaxial growth of silicon carbide in the gas phase is nonequilibrium. Therefore, crystal defects are likely to occur in the silicon carbide epitaxial growth film being formed and there also arises a problem of ease of roughening of the crystal structure.

An example of a method for epitaxial growth of silicon carbide other than the modified Lely method is metastable solvent epitaxy (MSE) which is a method of epitaxially growing silicon carbide in the liquid phase, as proposed for example in Patent Literature 2.

In MSE, a seed material made of a crystalline silicon carbide, such as a monocrystalline silicon carbide or a polycrystalline silicon carbide, and a feed material made of silicon carbide are faced each other at a distance as small as, for example, 100 μm or less and a Si melt layer is interposed between them. Then, these materials are subjected to heating treatment in a vacuum, high-temperature environment to epitaxially grow silicon carbide on the surface of the seed material.

It is considered that in MSE a difference in chemical potential between the seed material and the feed material causes a concentration gradient of carbon dissolved in the Si melt layer and thus a silicon carbide epitaxial growth film is formed. Therefore, unlike the case of using the modified Lely method, there is not necessarily a need to provide a temperature difference between the seed material and the feed material. Hence, with the use of MSE, not only the process for epitaxial growth of silicon carbide can be easily controlled with a simple apparatus but also a high-quality silicon carbide epitaxial growth film can be stably formed.

In addition, MSE also has the advantage of being capable of forming a silicon carbide epitaxial growth film even on a large-area seed substrate and the advantage of lowering the temperature for the process of epitaxially growing silicon carbide because the extremely small thickness of the Si melt layer facilitates the diffusion of carbon from the feed material.

Accordingly, MSE is considered to be an extremely useful method as the method for epitaxial growth of a monocrystalline silicon carbide and active research on MSE has been carried out.

CITATION LIST

Patent Literature

Patent Literature 1: JP-A-2005-97040
Patent Literature 2: JP-A-2008-230946

SUMMARY OF INVENTION

Technical Problem

As described above, it is considered that in MSE the feed material and the seed material should be selected so that the feed material has a higher free energy than the seed material. Therefore, for example, Patent Literature 2 above describes that a feed substrate and a seed substrate are made different from each other in free energy by making the feed substrate and the seed substrate different in crystal polymorph. More specifically, the literature describes that if the feed substrate is formed of a polycrystalline 3C—SiC substrate, the seed substrate is formed such as of a monocrystalline 4H—SiC substrate having a lower free energy than the 3C—SiC substrate.

In this relation, a polycrystalline 3C—SiC substrate can be easily produced by CVD. Therefore, as described in Patent Literature 2, the use of a 3C—SiC substrate as the feed substrate enables a low cost of formation of a silicon carbide epitaxial growth film.

However, among silicon carbide substrates including a 4H—SiC substrate and a 3C—SiC substrate, the 3C—SiC substrate has the highest free energy. Therefore, it has been considered that the 3C—SiC substrate cannot be used as the seed substrate required to have low free energy. For this reason, in Patent Literature 2, the monocrystalline 4H—SiC substrate, which is difficult and expensive to produce, is used as the seed substrate. This presents a problem of rise in cost of forming a silicon carbide epitaxial growth film.

The present invention has been made in view of the foregoing points and an object thereof is to reduce the cost of liquid phase epitaxial growth of a monocrystalline silicon carbide.

Solution to Problem

The inventors have found through intensive studies that, among polycrystalline silicon carbide materials with a 3C crystal polymorph, there are materials likely to be eluted into a silicon melt layer and materials less likely to be eluted into a silicon melt layer and that if a polycrystalline silicon carbide material less likely to be eluted into a silicon melt layer is used as a seed material and a polycrystalline silicon carbide material likely to be eluted into a silicon melt layer is used as a feed material, liquid phase epitaxial growth of a monocrystalline silicon carbide can be suitably performed. As a result, the inventors have led to the accomplishment of the invention.

Specifically, a unit for liquid phase epitaxial growth of a monocrystalline silicon carbide according to the present invention is a unit used in a method for liquid phase epitaxial growth of a monocrystalline silicon carbide and including a seed material and a feed material. The feed material includes a surface layer containing a polycrystalline silicon carbide with a 3C crystal polymorph. The feed material is such that when the surface layer thereof is subjected to X-ray diffraction, a diffraction peak corresponding to a (111) crystal plane and a diffraction peak other than the diffraction peak corresponding to the (111) crystal plane are observed as diffraction peaks corresponding to the polycrystalline silicon carbide with a 3C crystal polymorph. The seed material includes a surface layer containing a polycrystalline silicon carbide with a 3C crystal polymorph. The seed material is such that when the surface layer thereof is subjected to X-ray diffraction, a first-order diffraction peak corresponding to a (111) crystal plane is observed as a diffraction peak corresponding to the polycrystalline silicon carbide with a 3C crystal polymorph but no other first-order diffraction peak having a diffraction intensity of 10% or more of the diffraction intensity of the first-order diffraction peak corresponding to the (111) crystal plane is observed. Therefore, the seed material of the unit for liquid phase epitaxial growth of a monocrystalline silicon carbide according to the present invention is relatively less likely to cause elution into the silicon melt layer, but the feed material thereof is relatively likely to cause elution into the silicon melt layer. Thus, with the use of the unit for liquid phase epitaxial growth of a monocrystalline silicon carbide according to the present invention, liquid phase epitaxial growth of a monocrystalline silicon carbide can be suitably performed. Furthermore, since in the present invention both the seed material and the feed material have their respective surface layers containing a polycrystalline silicon carbide with a 3C crystal polymorph, each of the seed material and the feed material can be produced with ease at low cost by CVD (chemical vapor deposition). Hence, in the present invention, as compared, for example, to the case where a seed material has a surface layer made of a monocrystalline silicon carbide, such as 4H—SiC or 6H—SiC, the cost of forming an epitaxial growth film of a monocrystalline silicon carbide can be reduced.

The reason why the elution into the silicon melt layer becomes less likely to occur when no other first-order diffraction peak having a diffraction intensity of 10% or more of the diffraction intensity of the first-order diffraction peak corresponding to the (111) crystal plane is observed can be that the degree of exposure of the (111) crystal plane less likely to be eluted into the silicon melt layer than the other crystal planes is increased. On the other hand, the reason why the elution into the silicon melt layer becomes likely to occur when a diffraction peak other than the diffraction peak corresponding to the (111) crystal plane is observed can be that the degree of exposure of crystal planes different from the (111) crystal plane and more likely to be eluted into the silicon melt layer than the (111) crystal plane is increased.

Furthermore, in the present invention, an epitaxial growth film of a hexagonal monocrystalline silicon carbide having superior properties can be formed. The reason for this is that because the (111) crystal plane is equivalent to the (0001) hexagonal crystal plane, stacking error easily occurs. Thus, it can be considered that with the use of the seed material having a large degree of exposure of the (111) crystal plane, the epitaxial growth of a hexagonal monocrystalline silicon carbide suitably progresses.

The term "method for liquid phase epitaxial growth" in the present invention refers to a method in which the seed material and the feed material are heated in a position facing each other with a silicon melt layer therebetween to form a concentration gradient of graphite melting in the silicon melt layer and a monocrystalline silicon carbide is epitaxially grown on the seed material using the concentration gradient.

The term "X-ray diffraction" in the present invention refers to diffraction using 8.048 keV X-rays ($CuK_\alpha$ rays).

The term "feed material" in the present invention refers to a material capable of feeding ingredients for epitaxial growth of a monocrystalline silicon carbide, such for example as Si, C, and SiC. On the other hand, the term "seed material" refers to a material on the surface of which a monocrystalline silicon carbide can grow.

The expression "diffraction peak is observed" in the present invention means that a diffraction peak having a peak intensity of 3% or more of the peak intensity of a first-order diffraction peak corresponding to the (111) crystal plane is observed.

The term "diffraction peak corresponding to the (111) crystal plane" in the present invention includes first-order and higher-order diffraction peaks corresponding to the (111) crystal plane.

The first-order diffraction peak corresponding to the (111) crystal plane upon X-ray diffraction of the surface layer of the feed material is preferably a main diffraction peak having the highest diffraction intensity among first-order diffraction peaks corresponding to the polycrystalline silicon carbide with a 3C crystal polymorph.

The diffraction peak observed upon X-ray diffraction of the surface layer of the feed material and other than the diffraction peak corresponding to the (111) crystal plane preferably includes at least one diffraction peak, each diffraction peak corresponding to one of a (200) crystal plane, a (220) crystal plane, and a (311) crystal plane. With this structure, the rate of epitaxial growth of the monocrystalline silicon carbide can be more effectively increased. The reason for this can be that the (200) crystal plane, the (220) crystal plane, and the (311) crystal plane are more likely to be eluted into the silicon melt layer than the (111) crystal plane. From the viewpoint of still more effectively increasing the rate of epitaxial growth of the monocrystalline silicon carbide, the diffraction peak observed upon X-ray diffraction of the surface layer of the feed material and other than the diffraction peak corresponding to the (111) crystal plane more preferably includes diffraction peaks, each corresponding to one of the (200) crystal plane, the (220) crystal plane, and the (311) crystal plane.

The sum of the intensities of first-order diffraction peaks other than the first-order diffraction peak corresponding to the (111) crystal plane upon X-ray diffraction of the surface layer of the feed material is preferably 10% or more of the sum of the intensities of all the first-order diffraction peaks and more preferably 20% or more thereof. With this structure, the proportion of the crystal planes other than the (111) crystal plane and having higher reactivity than the (111) crystal plane can be further increased. Therefore, the rate of epitaxial growth of the monocrystalline silicon carbide can be more effectively increased.

Preferably, each of the feed material and the seed material includes a surface layer containing a polycrystalline silicon carbide with a 3C crystal polymorph and is such that upon X-ray diffraction of the surface layer at least one first-order diffraction peak is observed, each first-order diffraction peak corresponding to one of a (111) crystal plane, a (200) crystal plane, a (220) crystal plane, and a (311) crystal plane, and the average crystallite diameter calculated from the at least one first-order diffraction peak of the feed material is smaller than that calculated from the at least one first-order diffraction peak of the seed material. With this structure, the rate of epitaxial growth of the monocrystalline silicon carbide can be still more effectively increased. The reason for this can be that the surface layer of the seed material has a smaller proportion of grain boundaries likely to be eluted into the silicon melt layer than the surface layer of the feed material, which makes it possible to increase the difference in elutability into the silicon melt layer between the seed material and the feed material.

The average crystallite diameter calculated from the first-order diffraction peak observed upon X-ray diffraction of the surface layer of the feed material and corresponding to the polycrystalline silicon carbide with a 3C crystal polymorph is more preferably 700 Å or less. With this structure, the rate of epitaxial growth of the monocrystalline silicon carbide can be still more effectively increased. The reason for this can be that the surface layer of the feed material is increased in proportion of high-reactivity grain boundaries of polycrystalline silicon carbide crystals, which makes it more likely to cause the elution from the surface layer of the feed material into the silicon melt layer.

Furthermore, the feed material is preferably such that when the surface layer thereof is subjected to X-ray diffraction, a first-order diffraction peak corresponding to the (111) crystal plane and at least one first-order diffraction peak each corresponding to one of the (200) crystal plane, the (220) crystal plane, and the (311) crystal plane are observed and $(I_1/I_0)^{-1} \cdot D^2$ is equal to or smaller than $10^8$, where:

$I_0$ represents the sum of the intensity of the first-order diffraction peak corresponding to the (111) crystal plane and the total intensity of the at least one first-order diffraction peak each corresponding to one of the (200) crystal plane, the (220) crystal plane, and the (311) crystal plane;

$I_1$ represents the total intensity of the at least one first-order diffraction peak each corresponding to one of the (200) crystal plane, the (220) crystal plane, and the (311) crystal plane; and D represents the average crystallite diameter calculated from the at least one first-order diffraction peak each corresponding to one of the (200) crystal plane, the (220) crystal plane, and the (311) crystal plane.

With this structure, the rate of epitaxial growth of the monocrystalline silicon carbide can be still more effectively increased. The reason for this can be that the surface layer of the feed material is increased in proportion of (200), (220), and (311) crystal planes having relatively high reactivity and is decreased in average crystallite diameter.

On the other hand, regarding the seed material, the average crystallite diameter calculated from the first-order diffraction peak observed upon X-ray diffraction of the surface layer thereof and corresponding to the polycrystalline silicon carbide with a 3C crystal polymorph is more preferably more than 700 Å. With this structure, the rate of epitaxial growth of the monocrystalline silicon carbide can be still more effectively increased. The reason for this can be that the surface layer of the seed material is decreased in proportion of high-reactivity grain boundaries of polycrystalline silicon carbide crystals, which makes it still less likely to cause the elution from the surface layer of the seed material into the silicon melt layer.

The term "crystallite diameter" in the present invention refers to the crystallite diameter calculated based on the Hall's equation shown in the following formula (1):

$$\beta \cdot (\cos \theta)/\lambda = 2\eta \cdot (\sin \theta)/\lambda + 1/\epsilon \qquad (1)$$

where:

$\beta$ represents the full width at half-maximum;

$\theta$ represents the Bragg angle of the diffraction line;

$\lambda$ represents the wavelength of X-ray used for measurement;

$\eta$ represents the value of inhomogeneous strain of the crystal; and $\epsilon$ represents the average crystallite diameter.

The feed material is preferably smaller than the seed material in terms of proportion of (111) crystal planes having an orientation angle of 67.5° or more in the (111) crystal planes observed by X-ray diffraction of the surface layer. With this structure, the rate of epitaxial growth of the monocrystalline silicon carbide can be still more effectively increased. The reason for this can be that the feed material becomes higher than the seed material in terms of degree of exposure of crystal planes having lower stability than the (111) crystal plane in the crystals whose (111) crystal planes are exposed, which makes it possible to increase the difference in elutability into the silicon melt layer between the seed material and the feed material.

From the viewpoint of still more effectively increasing the rate of epitaxial growth of the monocrystalline silicon carbide, the proportion of (111) crystal planes having an orientation angle of 67.5° or more in the (111) crystal planes observed by X-ray diffraction of the surface layer of the feed material is more preferably less than 80%. Furthermore, the proportion of (111) crystal planes having an orientation angle of 67.5° or more in the (111) crystal planes observed by X-ray diffraction of the surface layer of the seed material is more preferably 80% or more.

Moreover, it is preferred that an LO peak derived from a polycrystalline silicon carbide with a 3C crystal polymorph be observed upon Raman spectroscopic analysis of each of the surface layers of the feed material and the seed material with an excitation wavelength of 532 nm, and that the feed material be smaller than the seed material in terms of absolute amount of shift of the LO peak from 972 cm$^{-1}$. In this case, the seed material becomes still less likely to cause elution into the silicon melt layer and the feed material becomes still more likely to cause elution into the silicon melt layer. As a result, the epitaxial growth film of the monocrystalline silicon carbide can be suitably formed at a higher rate of growth.

The reason why a larger absolute amount of shift of the LO peak from 972 cm$^{-1}$ makes it less likely to cause the elution into the silicon melt layer can be that the internal stress of the surface layer is increased to increase the denseness of the surface layer. On the other hand, the reason why a smaller absolute amount of shift thereof makes it more likely to cause the elution into the silicon melt layer can be that the internal stress of the surface layer is reduced to reduce the denseness of the surface layer. In addition, owing to the increase in denseness of the surface layer of the seed material, a majority of the crystal planes exposed on the surface layer of the seed material will have a shape similar to the (0001) hexagonal crystal plane. This also can be considered to contribute to the reduced elutability of the seed material.

The term "LO peak derived from a polycrystalline silicon carbide" in the present invention refers to a peak which is derived from the longitudinal optical mode among optical modes of oscillation between the two atoms of Si—C in the silicon carbide crystal and generally, in the case of a 3C polymorph, appears at 972 cm$^{-1}$.

From the viewpoint of further increasing the rate of liquid phase epitaxial growth of the monocrystalline silicon carbide, the absolute amount of shift of the LO peak from 972 cm$^{-1}$ in the feed material is preferably less than 4 cm$^{-1}$. The absolute amount of shift of the LO peak from 972 cm$^{-1}$ in the seed material is preferably 4 cm$^{-1}$ or more.

Furthermore, the full width at half-maximum of the LO peak in the feed material is preferably 7 cm$^{-1}$ or more. The full width at half-maximum of the LO peak in the seed material is preferably 15 cm$^{-1}$ or less.

The reason why the rate of liquid phase epitaxial growth of the monocrystalline silicon carbide can be further increased when the full width at half-maximum of the LO peak in the feed material is 7 cm$^{-1}$ or more can be that larger full widths at half-maximum of the LO peak can be caused by lower degrees of crystallinity or higher impurity concentrations of the polycrystalline silicon carbide in the surface layer, which makes it more likely to cause the elution from the surface layer. On the other hand, the reason why the rate of liquid phase epitaxial growth of the monocrystalline silicon carbide can be further increased when the full width at half-maximum of the LO peak in the seed material is 15 cm$^{-1}$ or less can be that smaller full widths at half-maximum of the LO peak can be caused by higher degrees of crystallinity or lower impurity concentrations of the polycrystalline silicon carbide in the surface layer, which makes it still less likely to cause the elution from the surface layer.

The surface layer of at least one of the feed material and the seed material preferably contains a polycrystalline silicon carbide with a 3C crystal polymorph as a major ingredient and is preferably substantially made of the polycrystalline silicon carbide with a 3C crystal polymorph. With this structure, the rate of epitaxial growth of the monocrystalline silicon carbide can be still more effectively increased.

The term "major ingredient" in the present invention refers to an ingredient which is contained in a proportion of 50% by mass or more in the surface layer.

The expression "substantially made of the polycrystalline silicon carbide with a 3C crystal polymorph" means that the surface layer contains no ingredient other than the polycrystalline silicon carbide with a 3C crystal polymorph, except for impurities. The content of impurities in the surface layer when "substantially made of the polycrystalline silicon carbide with a 3C crystal polymorph" is generally 5% by mass or less.

At least one of the feed material and the seed material may include a support member and a polycrystalline silicon carbide film formed on the support member and forming the surface layer. In this case, the polycrystalline silicon carbide film preferably has a thickness within a range of 30 μm to 800 μm.

At least one of the feed material and the seed material may be formed of a polycrystalline silicon carbide material containing a polycrystalline silicon carbide with a 3C crystal polymorph.

A method for liquid phase epitaxial growth of a monocrystalline silicon carbide according to the present invention is a method for liquid phase epitaxial growth of a monocrystalline silicon carbide using the unit for liquid phase epitaxial growth of a monocrystalline silicon carbide according to the present invention. In the method for liquid phase epitaxial growth of a monocrystalline silicon carbide according to the present invention, the seed material and the feed material are heated with the surface layers of the seed material and the feed material facing each other through a silicon melt layer to epitaxially grow a monocrystalline silicon carbide on the surface layer of the seed material.

With this method, an epitaxial growth film of the monocrystalline silicon carbide can be formed at low cost. In addition, there is not necessarily a need to provide a temperature difference between the seed material and the feed material. Therefore, not only the process for epitaxial growth of a monocrystalline silicon carbide can be easily controlled with a simple apparatus but also a high-quality monocrystalline silicon carbide epitaxial growth film can be stably formed.

Advantageous Effects of Invention

The present invention can reduce the cost of liquid phase epitaxial growth of a monocrystalline silicon carbide.

DESCRIPTION OF EMBODIMENTS

A description will be given below of an example of a preferred embodiment for working of the present invention. However, the following embodiment is simply illustrative. The present invention is not at all limited by the following embodiment.

Figure 1:
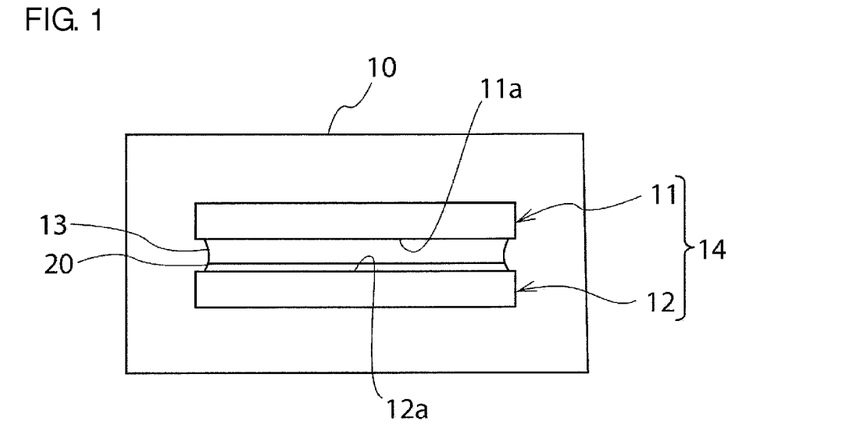
FIG. 1 is a schematic view for illustrating a method for epitaxial growth of a monocrystalline silicon carbide in one embodiment of the present invention.

FIG. 1 is a schematic view for illustrating a method for epitaxial growth of a monocrystalline silicon carbide in this embodiment.

The embodiment describes an example in which an epitaxial growth film of a monocrystalline silicon carbide is formed using MSE.

In this embodiment, as shown in FIG. 1, a unit 14 for liquid phase epitaxial growth of a monocrystalline silicon carbide, including a seed substrate 12 as the seed material and a feed substrate 11 as the feed material, is arranged in a vessel 10 so that a principal surface 12a of the seed substrate 12 and a principal surface 11a of the feed substrate 11 face each other with a silicon plate therebetween. In this position, the seed substrate 12 and the feed substrate 11 are heated to melt the silicon plate. Thus, the seed substrate 12 and the feed substrate 11 are faced each other with a silicon melt layer 13 therebetween. By keeping this state, source materials including silicon, carbon, and silicon carbide are eluted from the seed substrate 12 into the silicon melt layer 13. Thus, a concentration gradient is formed in the silicon melt layer 13. As a result, a monocrystalline silicon carbide epitaxially grows on the principal surface 12a of the seed substrate 12, resulting in the formation of a monocrystalline silicon carbide epitaxial growth film 20. The thickness of the silicon melt layer 13 is extremely small and can be, for example, about 10 μm to about 100 μm.

Figure 2:
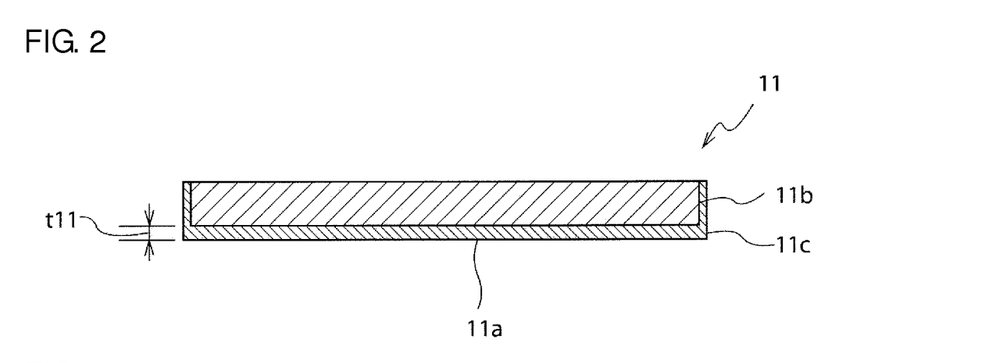
FIG. 2 is a schematic cross-sectional view of a feed substrate in the one embodiment of the present invention.
Figure 3:
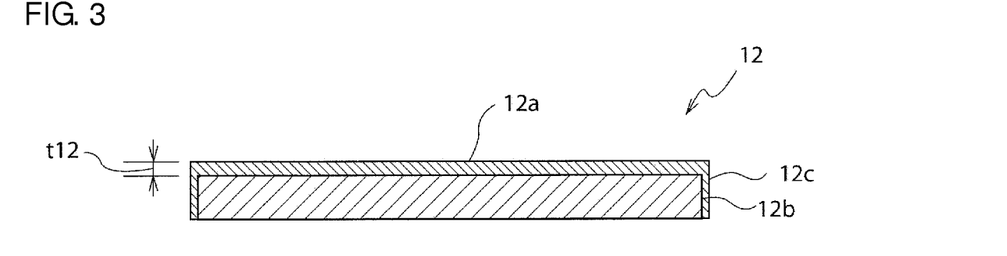
FIG. 3 is a schematic cross-sectional view of a seed substrate in the one embodiment of the present invention.

FIG. 2 shows a schematic cross-sectional view of the feed substrate 11. FIG. 3 shows a schematic cross-sectional view of the seed substrate 12. Each of the feed substrate 11 and the seed substrate 12 includes a surface layer containing a polycrystalline silicon carbide with a 3C crystal polymorph. Specifically, in this embodiment, as shown in FIGS. 2 and 3, the feed substrate 11 and the seed substrate 12 include graphite-made support members 11b and 12b, respectively, and polycrystalline silicon carbide films 11c and 12c, respectively. The graphite-made support members 11b and 12b have high thermal resistance so that they can sufficiently withstand the process for epitaxial growth of silicon carbide. Furthermore, the graphite-made support members 11b and 12b have a coefficient of thermal expansion similar to that of the monocrystalline silicon carbide epitaxial growth film 20. Therefore, with the use of the graphite-made support members 11b and 12b, the silicon carbide epitaxial growth film 20 can be suitably formed.

Specific examples of graphite include natural graphite, artificial graphite, petroleum coke, coal coke, pitch coke, carbon black, and mesocarbon. An example of a method for producing the graphite-made support member 12b is a production method described in JP-A-2005-132711.

The polycrystalline silicon carbide films 11c and 12c are formed to cover the principal and side surfaces of the support members 11b and 12b, respectively. Each of the polycrystalline silicon carbide films 11c and 12c contain a polycrystalline silicon carbide. The surface layers of the feed substrate 11 and the seed substrate 12 are formed of the polycrystalline silicon carbide films 11c and 12c, respectively. The polycrystalline silicon carbide films 11c and 12c in this embodiment preferably contain polycrystalline 3C—SiC as a major ingredient and are preferably substantially made of polycrystalline 3C—SiC. In other words, in this embodiment, the surface layer of each of the feed substrate 11 and the seed substrate 12 preferably contains polycrystalline 3C—SiC as a major ingredient and is preferably substantially made of polycrystalline 3C—SiC. Thus, the rate of growth of the monocrystalline silicon carbide epitaxial growth film 20 can be increased.

Each of the thicknesses t11 and t12 of the polycrystalline silicon carbide films 11c and 12c is preferably within a range of 30 μm to 800 μm, more preferably within a range of 40 μm to 600 μm, and still more preferably within a range of 100 μm to 300 μm. If the thicknesses t11 and t12 of the polycrystalline silicon carbide films 11c and 12c are too small, the graphite-made support member 12b may be exposed during the formation of a monocrystalline silicon carbide epitaxial growth film 20, thus causing elution from the support members 11b and 12b and resulting in failure to obtain a suitable monocrystalline silicon carbide epitaxial growth film 20. On the other hand, if the thicknesses t11 and t12 of the polycrystalline silicon carbide films 11c and 12c are too large, the polycrystalline silicon carbide film 12c may be likely to produce cracks.

No particular limitation is placed on the method for forming the polycrystalline silicon carbide films 11c and 12c. The polycrystalline silicon carbide film 12c can be formed, for example, by CVD (chemical vapor deposition) or sputtering. Particularly in this embodiment, since the polycrystalline silicon carbide films 11c and 12c contain polycrystalline 3C—SiC, dense polycrystalline silicon carbide films 11c and 12c can be formed with ease at low cost by CVD.

The polycrystalline silicon carbide film 11c forming the surface layer of the feed substrate 11 is such that when it is subjected to X-ray diffraction, a diffraction peak corresponding to the (111) crystal plane and a diffraction peak other than the diffraction peak corresponding to the (111) crystal plane are observed as diffraction peaks corresponding to a crystal polymorph of polycrystalline 3C—SiC. The polycrystalline silicon carbide film 11c is preferably such that when it is subjected to X-ray diffraction, a diffraction peak corresponding to the (111) crystal plane and a first-order diffraction peak corresponding to a crystal plane other than the (111) crystal plane and having a greater intensity than 10% of the intensity of the first-order diffraction peak corresponding to the (111) crystal plane are observed as diffraction peaks corresponding to a crystal polymorph of polycrystalline 3C—SiC.

Diffraction peaks corresponding to a crystal polymorph of polycrystalline 3C—SiC include, as also shown in Table 1 below, a diffraction peak corresponding to the (111) crystal plane, a diffraction peak corresponding to the (200) crystal plane, a diffraction peak corresponding to the (220) crystal plane, and a diffraction peak corresponding to a diffraction peak corresponding to the (311) crystal plane. Therefore, more specifically, the polycrystalline silicon carbide film 11c is such that when it is subjected to X-ray diffraction, a diffraction peak corresponding to the (111) crystal plane and at least one diffraction peak each corresponding to one of the (200) crystal plane, the (220) crystal plane, and the (311) crystal plane are observed as diffraction peaks corresponding to a crystal polymorph of polycrystalline 3C—SiC.

On the other hand, the polycrystalline silicon carbide film 12c forming the surface layer of the seed substrate 12 is such that when it is subjected to X-ray diffraction, a first-order diffraction peak corresponding to the (111) crystal plane is observed as a diffraction peak corresponding to a crystal polymorph of polycrystalline 3C—SiC but no other first-order diffraction peak having a diffraction intensity of 10% or more of the diffraction intensity of the first-order diffraction peak corresponding to the (111) crystal plane is observed.

TABLE 1

| Corresponding Crystal Plane | 2θ(°) |
|---|---|
| (111) | 35.6 |
| (200) | 41.4 |
| (220) | 60.0 |
| (311) | 71.7 |

Hence, the seed material 12 is relatively less likely to cause elution into the silicon melt layer 13, but the feed material 11 is relatively likely to cause elution into the silicon melt layer 13. Thus, with the use of the unit 14 for liquid phase epitaxial growth of a monocrystalline silicon carbide in this embodiment, a liquid phase epitaxial growth film 20 of a monocrystalline silicon carbide can be suitably formed. Furthermore, both the seed material 12 and the feed material 11 have their respective surface layers containing a polycrystalline silicon carbide with a 3C crystal polymorph. Therefore, each of the seed material 12 and the feed material 11 can be formed with ease at low cost by CVD. Hence, as compared to the case where a seed material has a surface layer made of a monocrystalline silicon carbide, such as 4H—SiC or 6H—SiC, the cost of forming an epitaxial growth film 20 of a monocrystalline silicon carbide can be reduced.

The reason why the elution into the silicon melt layer 13 becomes less likely to occur when no other first-order diffraction peak having a diffraction intensity of 10% or more of the diffraction intensity of the first-order diffraction peak corresponding to the (111) crystal plane is observed can be that the degree of exposure of the (111) crystal plane less likely to be eluted into the silicon melt layer than the other crystal planes is increased. On the other hand, the reason why the elution into the silicon melt layer 13 becomes likely to occur when a diffraction peak other than the diffraction peak corresponding to the (111) crystal plane is observed can be that the degree of exposure of crystal planes different from the (111) crystal plane and more likely to be eluted into the silicon melt layer than the (111) crystal plane is increased.

In addition, with the use of the unit 14 for liquid phase epitaxial growth of a monocrystalline silicon carbide according to this embodiment, an epitaxial growth film 20 of a hexagonal monocrystalline silicon carbide having superior properties can be formed. The reason for this can be that because the (111) crystal plane is equivalent to the (0001) hexagonal crystal plane, the use of the seed material 12 having a large degree of exposure of the (111) crystal plane suitably promotes the epitaxial growth of a hexagonal monocrystalline silicon carbide.

Typical examples of the hexagonal monocrystalline silicon carbide include a monocrystalline silicon carbide with a 4H crystal polymorph and a monocrystalline silicon carbide with a 6H crystal polymorph. These monocrystalline silicon carbides with a 4H or 6H crystal polymorph (4H—SiC and 6H—SiC) have the advantage of enabling semiconductor devices having a larger band gap and higher thermal resistance than other silicon carbides with different crystal polymorphs.

Among a plurality of first-order diffraction peaks observed as diffraction peaks corresponding to a crystal polymorph of polycrystalline 3C—SiC when the polycrystalline silicon carbide film 11c is subjected to X-ray diffraction, a first-order diffraction peak corresponding to the (111) crystal plane is preferably a main diffraction peak having the highest diffraction intensity.

The polycrystalline silicon carbide film 11c is such that when subjected to X-ray diffraction, in addition to a diffraction peak corresponding to the (111) crystal plane, at least one diffraction peak each corresponding to one of the (200) crystal plane, the (220) crystal plane, and the (311) crystal plane is preferably observed as a diffraction peak corresponding to a crystal polymorph of polycrystalline 3C-silicon carbide and, more preferably, diffraction peaks each corresponding to one of the (200) crystal plane, the (220) crystal plane, and the (311) crystal plane are observed. In this case, the rate of growth of the monocrystalline silicon carbide epitaxial growth film 20 can be further increased. The reason for this can be that, among the crystal planes other than the (111) crystal plane, the (200) crystal plane, the (220) crystal plane, and the (311) crystal plane have particularly high reactivity and thus are more likely to cause the elution into the silicon melt layer 13.

Moreover, the sum of the intensities of first-order diffraction peaks other than the first-order diffraction peak corresponding to the (111) crystal plane is preferably 10% or more of the sum of the intensities of all the first-order diffraction peaks and more preferably 20% or more thereof. In this case, the rate of growth of the monocrystalline silicon carbide epitaxial growth film 20 can be still further increased.

(Average Crystallite Diameter of Polycrystalline Silicon Carbide in Polycrystalline Silicon Carbide Films 11c and 12c)

The average crystallite diameter calculated from the first-order diffraction peak observed by X-ray diffraction of the polycrystalline silicon carbide film 11c is preferably smaller than the average crystallite diameter calculated from the first-order diffraction peak observed by X-ray diffraction of the polycrystalline silicon carbide film 12c. With this structure, the rate of epitaxial growth of the monocrystalline silicon carbide can be still more effectively increased. The reason for this can be that the polycrystalline silicon carbide film 12c has a smaller proportion of grain boundaries likely to be eluted into the silicon melt layer than the polycrystalline silicon carbide film 11c, which makes it possible to increase the difference in elutability into the silicon melt layer 13 between the seed material 12 and the feed material 11.

The polycrystalline silicon carbide film 11c is preferably such that the average crystallite diameter calculated from the first-order diffraction peak observed by X-ray diffraction and corresponding to the polycrystalline silicon carbide with a 3C crystal polymorph is 700 A or less. In this case, the rate of growth of the monocrystalline silicon carbide epitaxial growth film 20 can be still further increased. The reason for this can be that the polycrystalline silicon carbide film 11c is increased in proportion of high-reactivity grain boundaries of polycrystalline silicon carbide crystals, which makes it more likely to cause the elution from the polycrystalline silicon carbide film 11c.

Furthermore, the polycrystalline silicon carbide film 11c is preferably such that when subjected to X-ray diffraction, a first-order diffraction peak corresponding to the (111) crystal plane and at least one first-order diffraction peak each corresponding to one of the (200) crystal plane, the (220) crystal plane, and the (311) crystal plane are observed and $(I_1/I_0)^{-1} \cdot D^2$ is equal to or smaller than $10^8$, where:

$I_0$ represents the sum of the intensity of the first-order diffraction peak corresponding to the (111) crystal plane and the total intensity of the at least one first-order diffraction peak each corresponding to one of the (200) crystal plane, the (220) crystal plane, and the (311) crystal plane;

$I_1$ represents the total intensity of the at least one first-order diffraction peak each corresponding to one of the (200) crystal plane, the (220) crystal plane, and the (311) crystal plane; and D represents the average crystallite diameter calculated using the Hall's equation from the at least one first-order diffraction peak each corresponding to one of the (200) crystal plane, the (220) crystal plane, and the (311) crystal plane.

In this case, the rate of growth of the monocrystalline silicon carbide epitaxial growth film 20 can be still more effectively increased. The reason for this can be that the polycrystalline silicon carbide film 11c is increased in proportion of (200), (220), and (311) crystal planes having relatively high reactivity and is decreased in average crystallite diameter.

On the other hand, the polycrystalline silicon carbide film 12c is preferably such that the average crystallite diameter calculated from the first-order diffraction peak observed by X-ray diffraction and corresponding to the polycrystalline silicon carbide with a 3C crystal polymorph is more than 700 A. In this case, the rate of growth of the monocrystalline silicon carbide epitaxial growth film 20 can be still further increased. The reason for this can be that the polycrystalline silicon carbide film 12c is decreased in proportion of high-reactivity grain boundaries of polycrystalline silicon carbide crystals, which makes it still less likely to cause the elution of the polycrystalline silicon carbide film 12c into the silicon melt layer.

(Orientation Angle of (111) Crystal Plane in Polycrystalline Silicon Carbide Films 11c and 12c)

The polycrystalline silicon carbide film 11c is preferably smaller than the polycrystalline silicon carbide film 12c in terms of proportion of (111) crystal planes having an orientation angle of 67.5° or more in the (111) crystal planes observed by X-ray diffraction. In this case, the rate of epitaxial growth of the monocrystalline silicon carbide can be still more effectively increased. The reason for this can be that the polycrystalline silicon carbide film 11c becomes higher than the polycrystalline silicon carbide film 12c in terms of degree of exposure of crystal planes having lower stability than the (111) crystal plane in the crystals whose (111) crystal planes are exposed, which makes it possible to increase the difference in elutability into the silicon melt layer 13 between the seed material 12 and the feed material 11.

From the viewpoint of still more effectively increasing the rate of epitaxial growth of the monocrystalline silicon carbide, the proportion of (111) crystal planes having an orientation angle of 67.5° or more in the (111) crystal planes observed by X-ray diffraction of the polycrystalline silicon carbide film 11c is more preferably less than 80%. Furthermore, the proportion of (111) crystal planes having an orientation angle of 67.5° or more in the (111) crystal planes observed by X-ray diffraction of the polycrystalline silicon carbide film 12c is more preferably 80% or more.

Moreover, in this embodiment, the seed substrate 12 and the feed substrate 11 are configured so that the polycrystalline silicon carbide film 11c forming the surface layer of the feed substrate 11 is smaller than the polycrystalline silicon carbide film 12c forming the surface layer of the seed substrate 12 in terms of absolute amount of shift of an LO peak observed by Raman spectroscopic analysis with an excitation wavelength of 532 nm and derived from a polycrystalline silicon carbide with a 3C crystal polymorph from 972 $cm^{-1}$. Therefore, the seed substrate 12 becomes still less likely to cause elution into the silicon melt layer 13 and the feed material 11 becomes still more likely to cause elution into the silicon melt layer 13. As a result, the epitaxial growth film of the monocrystalline silicon carbide can be suitably formed at a higher rate of growth.

As stated above, the seed substrate 12 and the feed substrate 11 are configured so that the polycrystalline silicon carbide film 11c forming the surface layer of the feed substrate 11 is smaller than the polycrystalline silicon carbide film 12c forming the surface layer of the seed substrate 12 in terms of absolute amount of shift of the LO peak from 972 $cm^{-1}$. Therefore, the epitaxial growth of a hexagonal monocrystalline silicon carbide can more suitably progress. The reason for this can be that the denseness of the surface layer of the seed substrate 12 is increased, so that a majority of the crystal planes exposed on the surface of the surface layer have a shape similar to the (0001) hexagonal crystal plane.

From the viewpoint of further increasing the rate of liquid phase epitaxial growth of the monocrystalline silicon carbide, the absolute amount of shift of the LO peak from 972 $cm^{-1}$ in the feed substrate 11 is preferably less than 4 $cm^{-1}$. In this case, it can be considered that the elution from the feed substrate 11 into the silicon melt layer 13 becomes more likely to occur, which makes it possible to further increase the rate of liquid phase epitaxial growth.

Furthermore, the absolute amount of shift of the LO peak from 972 $cm^{-1}$ in the seed substrate 12 is preferably 4 $cm^{-1}$ or more. In this case, it can be considered that the elution from the seed substrate 12 into the silicon melt layer 13 becomes still less likely to occur, which makes it possible to further increase the rate of liquid phase epitaxial growth. Moreover, the amount of shift of the LO peak from 972 $cm^{-1}$ in the seed substrate 12 is preferably 4 $cm^{-1}$ or more.

In the feed substrate 11, the full width at half-maximum of the LO peak is preferably 7 $cm^{-1}$ or more. In this case, the rate of epitaxial growth of the monocrystalline silicon carbide can be still further increased. The reason for this can be that larger full widths at half-maximum of the LO peak can be caused by lower degrees of crystallinity or higher impurity concentrations of the polycrystalline silicon carbide in the surface layer, which makes it more likely to cause the elution from the surface layer.

On the other hand, in the seed substrate 12, the full width at half-maximum of the LO peak is preferably 15 $cm^{-1}$ or less. In this case, the rate of epitaxial growth of the monocrystalline silicon carbide can be still further increased. The reason for this can be that smaller full widths at half-maximum of the LO peak can be caused by higher degrees of crystallinity or lower impurity concentrations of the polycrystalline silicon carbide in the surface layer of the seed substrate 12, which makes it still less likely to cause the elution from the surface layer of the seed substrate 12.

Therefore, the full width at half-maximum of the LO peak in the feed substrate 11 is preferably smaller than that of the LO peak in the seed substrate 12.

Figure 4:
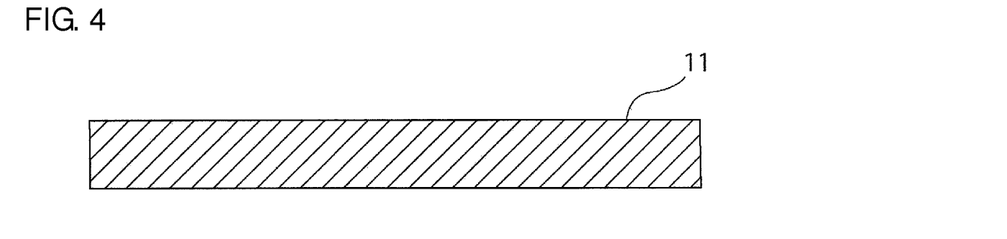
FIG. 4 is a schematic cross-sectional view of a feed substrate in a modification.
Figure 5:
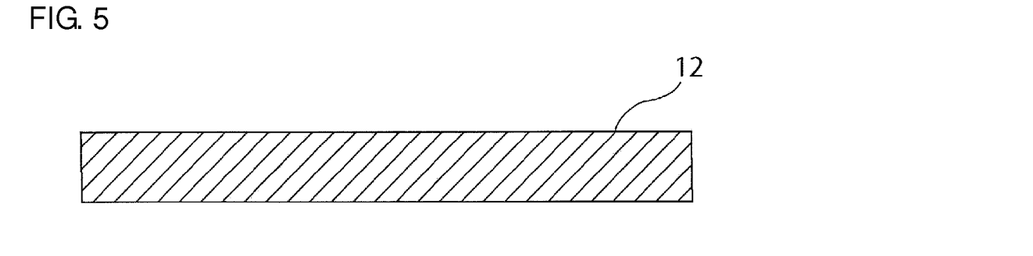
FIG. 5 is a schematic cross-sectional view of a seed substrate in the modification.

The above embodiment has described an example in which each of the feed substrate 11 and the seed substrate 12 is formed of a support member 11b or 12b and a polycrystalline silicon carbide film 11c or 12c. However, the present invention is not limited to the above structure. For example, as shown in FIGS. 4 and 5, each of the feed substrate 11 and the seed substrate 12 may be formed of a polycrystalline silicon substrate containing a polycrystalline silicon carbide.

The silicon carbide substrate can be produced, for example, by coating a graphite base material with a polycrystalline silicon carbide by CDV and then mechanically or chemically removing graphite. Alternatively, the silicon carbide substrate can be produced by reacting a graphite material with silicate gas to convert the graphite material into silicon carbide. Still alternatively, the silicon carbide substrate can be produced by adding a sintering aid to silicon carbide powder and sintering the silicon carbide powder at a high temperature of 1600° C. or above.

The present invention will be further described below with reference to specific examples, but is not at all limited by the following specific examples.

PRODUCTION EXAMPLE 1

A graphite material (15 mm by 15 mm by 2 mm) made of high-purity isotropic graphite having a bulk density of 1.85 g/cm$^3$ and an ash content of 5 ppm or less was used as a base material. The base material was put into a CVD reactor and a 30 μm thick polycrystalline silicon carbide coating was formed on the base material by CVD to produce Sample 1. Silicon tetrachloride and propane gas were used as source gases. The deposition was performed at an ordinary pressure and 1200° C. The deposition rate was at 30 μm/h.

PRODUCTION EXAMPLE 2

A 50 μm thick polycrystalline silicon carbide coating was formed on the surface of a graphite material in the same manner as in Production Example 1 above except that the reaction temperature was at 1400° C. and the deposition rate was at 60 μm/h, resulting in the production of Sample 2.

PRODUCTION EXAMPLE 3

A 50 μm thick polycrystalline silicon carbide coating was formed on the surface of a graphite material in the same manner as in Production Example 1 above except that the reaction temperature was at 1250° C., the deposition rate was at 10 μm/h, and $CH_3SiCl_3$ was used instead of silicon tetrachloride, resulting in the production of Sample 3.

PRODUCTION EXAMPLE 4

A 50 μm thick polycrystalline silicon carbide coating was formed on the surface of a graphite material in the same manner as in Production Example 1 above except that dichlorosilane ($SiH_2Cl_2$) and acetylene were used instead of silicon tetrachloride and propane gas, the reaction temperature was at 1300° C., and the deposition rate was at 10 μm/h, resulting in the production of Sample 4. In Sample 4, the thickness of the polycrystalline silicon carbide coating was approximately 1 mm.

(X-Ray Diffraction Measurement)

The surface layers of the above produced Samples 1 to 4 were subjected to X-ray diffraction. The X-ray diffraction was performed using Ultima manufactured by Rigaku Corporation. The measurement results are shown in FIG. 6.

Figure 6:
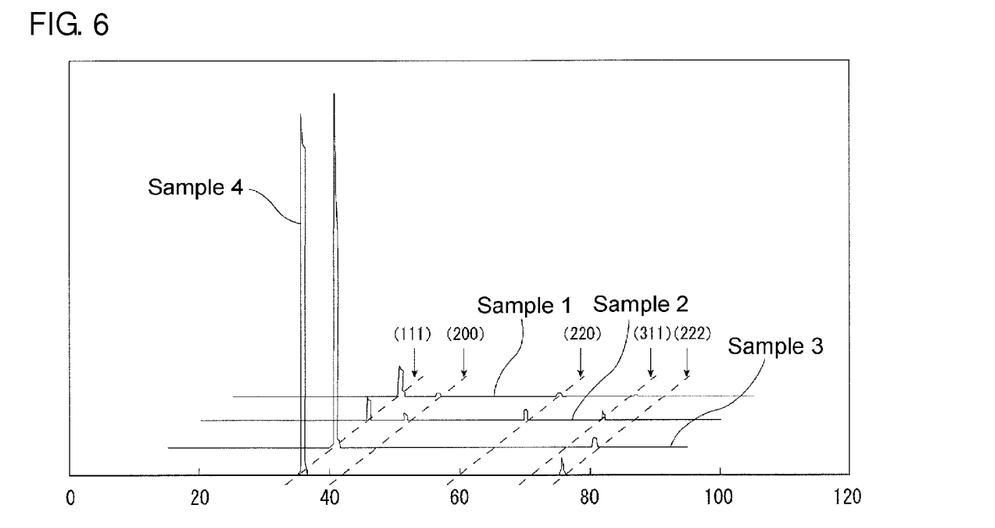
FIG. 6 is an X-ray diffraction chart relating to Samples 1 to 4.

As shown in FIG. 6, in Samples 1 and 2, not only a diffraction peak (2θ=35.6°) corresponding to the (111) crystal plane but also diffraction peaks corresponding to crystal planes other than the (111) crystal plane were observed. Specifically, in Samples 1 and 2, not only a diffraction peak (2θ=35.6°) corresponding to the (111) crystal plane but also a diffraction peak (2θ=41.4°) corresponding to the (200) crystal plane, a diffraction peak (2θ=60.0°) corresponding to the (220) crystal plane, and a diffraction peak (2θ=71.7°) corresponding to the (311) crystal plane were observed.

On the other hand, in Samples 3 and 4, a first-order diffraction peak (2θ=35.6°) corresponding to the (111) crystal plane and a diffraction peak (2θ=75.5°) corresponding to the (222) crystal plane, which is a higher-order diffraction peak of the above first-order diffraction peak, were observed, but no other first-order diffraction peak having an intensity of 10% or more of the intensity of the first-order diffraction peak corresponding to the (111) crystal plane was observed.

Arranged in Table 2 below are the relative intensities of the first-order diffraction peaks corresponding to various crystal planes in Samples 1 to 4, with 100 representing the intensity of the first-order diffraction peak corresponding to the (111) crystal plane.

TABLE 2

| Corresponding Crystal Plane | Relative Intensity of First-Order Diffraction Peak | | | |
| --- | --- | --- | --- | --- |
| | Sample 1 | Sample 2 | Sample 3 | Sample 4 |
| (111) | 100 | 100 | 100 | 100 |
| (200) | 13 | 40 | 0 | 0 |
| (220) | 12 | 51 | 0 | 0 |
| (311) | 12 | 47 | 1 | 0 |

(Calculation of Average Crystallite Diameter)

The average crystallite diameters of Samples 1 to 4 were calculated based on the results of the above X-ray diffraction measurement, using the Hall's equation. In the calculation, data of diffraction peaks relating to the (111) crystal plane, the (200) crystal plane, the (220) crystal plane, and the (311) crystal plane were used. The results are shown in Table 3 below.

TABLE 3

| | Average Crystallite Diameter (A) |
| --- | --- |
| Sample 1 | 350 |
| Sample 2 | 455 |
| Sample 3 | 1136 |
| Sample 4 | 1012 |

As seen from the results shown in Table 3 above, the average crystallite diameters of Samples 1 and 2 were less than 700 A, more specifically, less than 500 A and the average crystallite diameters of Samples 3 and 4 were more than 700 A, more specifically, more than 1000 A.

(Evaluation of Orientation of (111) Crystal Plane)

Figure 7:
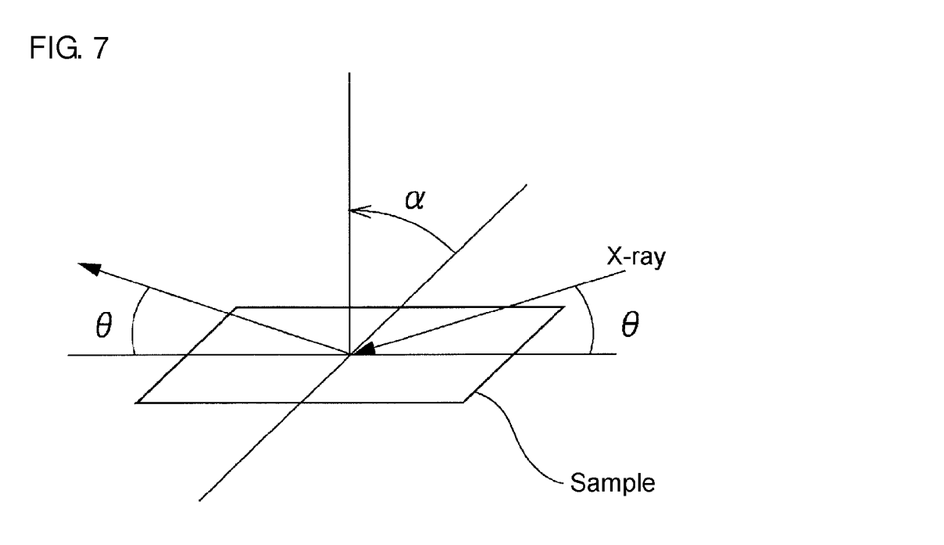
FIG. 7 is a schematic diagram for illustrating a method for measuring the orientation of a (111) crystal plane.

Next, Samples 1 to 4 were measured in terms of angle at which the diffraction peak corresponding to the (111) plane appeared while each of them was rotated as shown in FIG. 7. The results are shown in FIGS. 8 to 11. In the graphs shown in FIGS. 8 to 11, the abscissa represents the orientation angle (α) shown in FIG. 7. The ordinate represents the intensity.

Furthermore, Table 4 below shows the proportion of the intensity integral in a region of 67.5° and higher orientation angles (α) to the intensity integral in an entire region of 15° to 90° orientation angles (α) ((intensity integral in region of 67.5° and higher orientation angles (α))/(intensity integral in entire region of 15° to 90° orientation angles (α)). Note that the ((intensity integral in region of 67.5° and higher orientation angles (α))/(intensity integral in entire region of 15° to 90° orientation angles (α)) corresponds to the proportion of (111) crystal plane having an orientation angle of 67.5° or more in the (111) crystal planes observed by X-ray diffraction.

TABLE 4

| | Proportion of (111) Crystal Planes Having 67.5° or Higher Orientation Angle |
|---|---|
| Sample 1 | 38.6% |
| Sample 2 | 48.5% |
| Sample 3 | 96.5% |
| Sample 4 | 96.9% |

Figure 8:
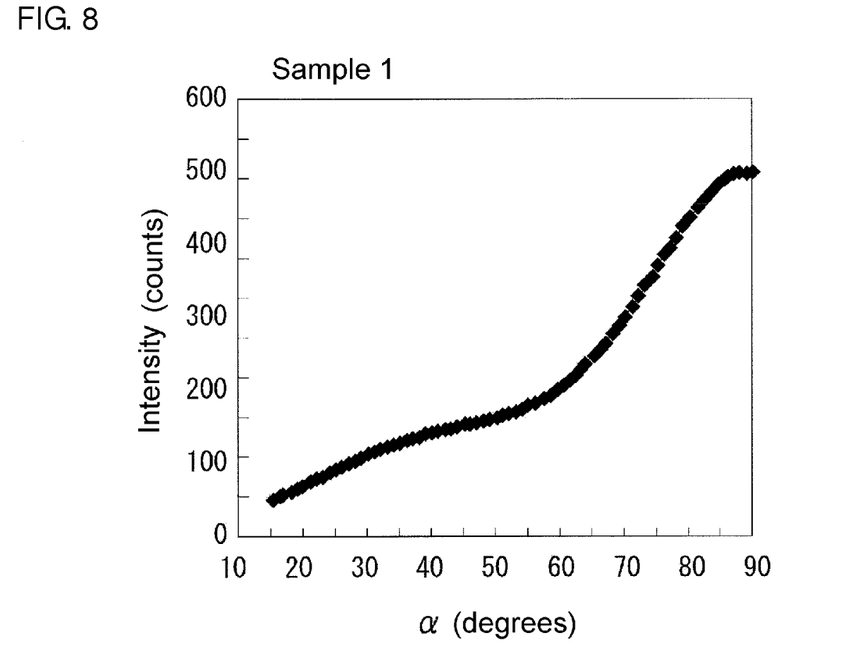
FIG. 8 is a graph showing the orientation of the (111) crystal plane in Sample 1.
Figure 9:
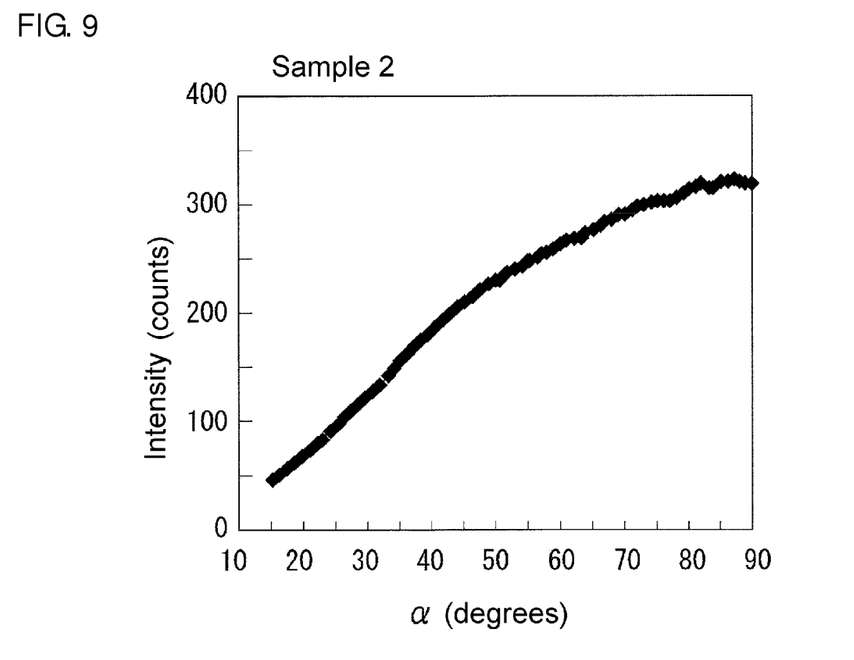
FIG. 9 is a graph showing the orientation of the (111) crystal plane in Sample 2.
Figure 10:
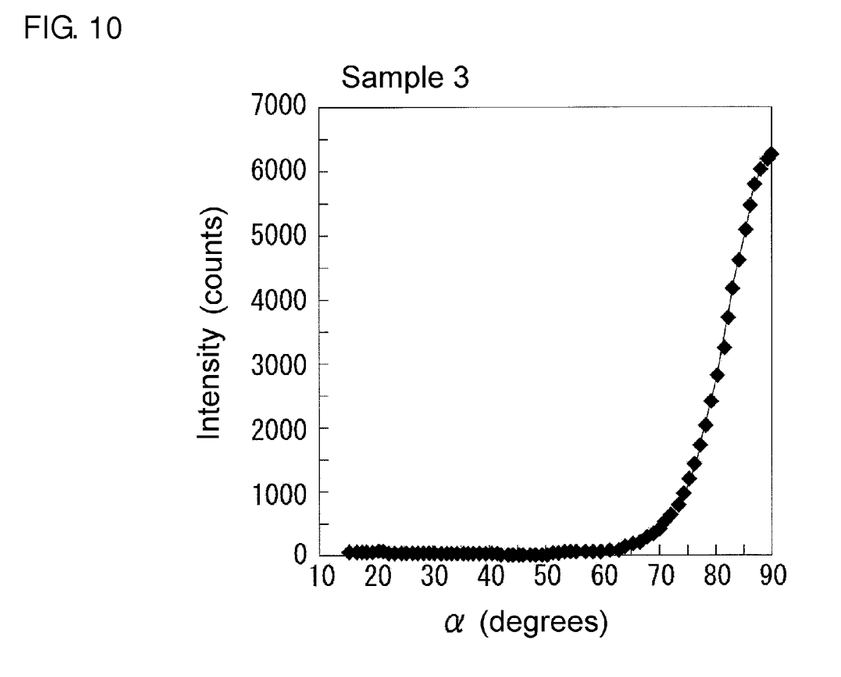
FIG. 10 is a graph showing the orientation of the (111) crystal plane in Sample 3.
Figure 11:
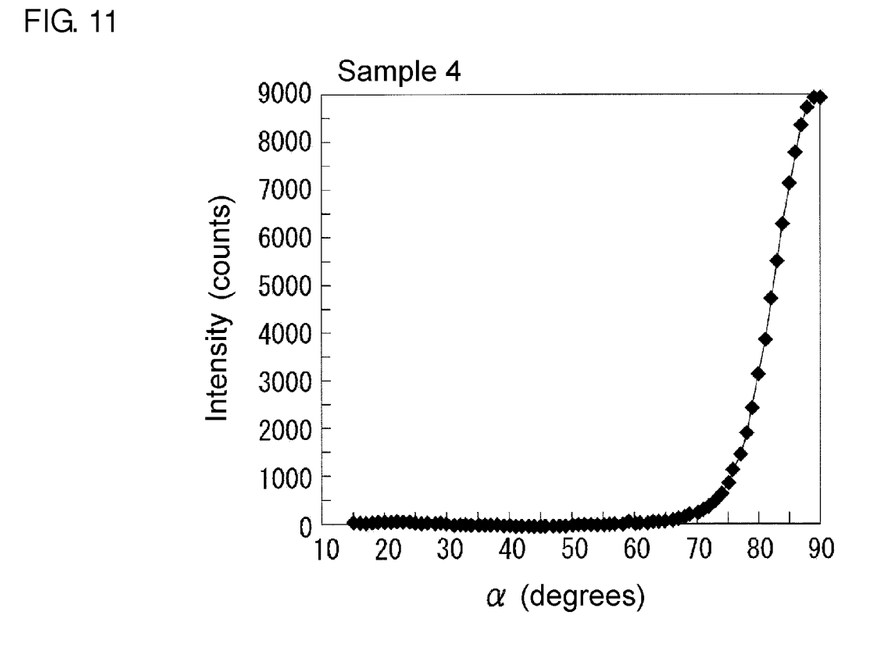
FIG. 11 is a graph showing the orientation of the (111) crystal plane in Sample 4.

As shown in FIGS. 8 and 9 and Table 4 above, in Samples 1 and 2, a wide intensity distribution existed also in a region of orientation angles (α) less than 67.5° and the proportion of (111) crystal planes having an orientation angle (α) of 67.5° or more was less than 80%. On the other hand, in Samples 3 and 4, no wide intensity distribution existed in a region of orientation angles (α) less than 67.5° and the proportion of (111) crystal planes having an orientation angle (α) of 67.5° or more was more than 80%.

(Raman Spectroscopic Analysis)

The surface layers of the above produced Samples 1 to 4 were subjected to Raman spectroscopic analysis. An excitation wavelength of 532 nm was used for the Raman spectroscopic analysis. The measurement results are shown in FIG. 12.

Figure 12:
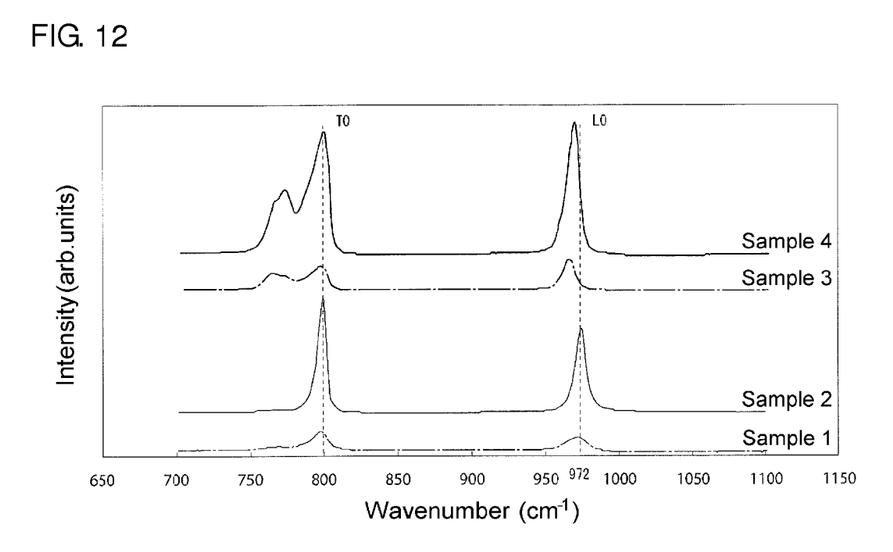
FIG. 12 is a graph showing the results of Raman spectroscopic analysis of the surface layers of Samples 1 to 4.

Next, from the measurement results shown in FIG. 12, the amounts (Δω) of shift of LO peaks from 972 cm$^{-1}$ in Samples 1 to 4 and full widths at half-maximum (FWHM) of the LO peaks were determined. The results are shown in FIG. 13.

Figure 13:
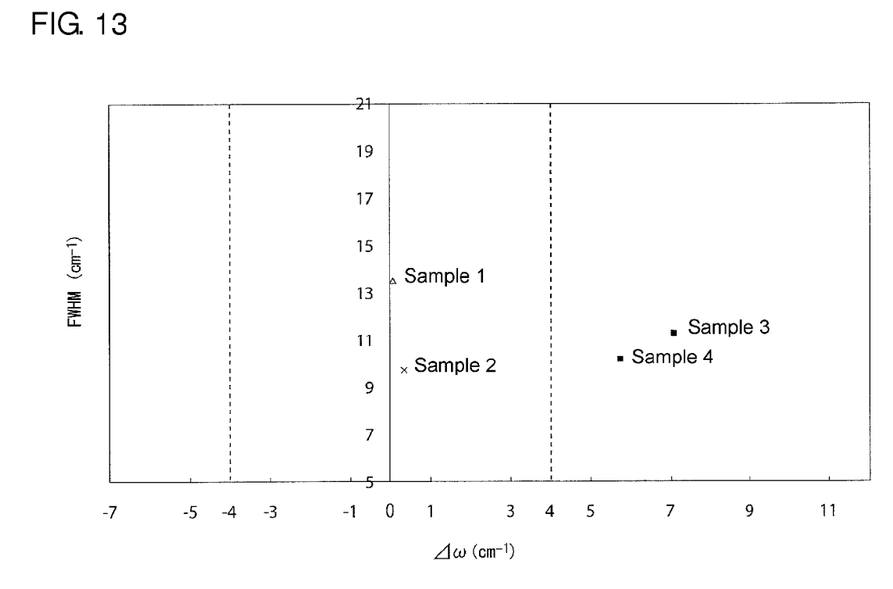
FIG. 13 is a graph showing the amounts (Δω) of shift of LO peaks from 972 cm$^{-1}$ in Samples 1 to 4 and the full widths at half-maximum (FWHM) of the LO peaks.

As shown in FIG. 13, Samples 3 and 4 each had an absolute value of Δω of more than 4 cm$^{-1}$ and an FWHM of more than 7 cm$^{-1}$. On the other hand, Samples 1 and 2 each had an FWHM of more than 7 cm$^{-1}$ like Samples 3 and 4, but their absolute values of Δω were less than 4 cm$^{-1}$.

(Evaluation of Rate of Growth of Monocrystalline Silicon Carbide Liquid Phase Epitaxial Growth Film)

Using Samples 1 to 4 as feed substrates, respective monocrystalline silicon carbide epitaxial growth films 20 were produced under the conditions shown below by the method for liquid phase epitaxial growth described in the above embodiment. Then, the thickness of each of the silicon carbide epitaxial growth films 20 was measured by observing the cross section of the silicon carbide epitaxial growth film 20 with an optical microscope. The rate of growth of each monocrystalline silicon carbide epitaxial growth film 20 was determined by dividing the measured thickness by the time for epitaxial growth of silicon carbide.

Figure 14:
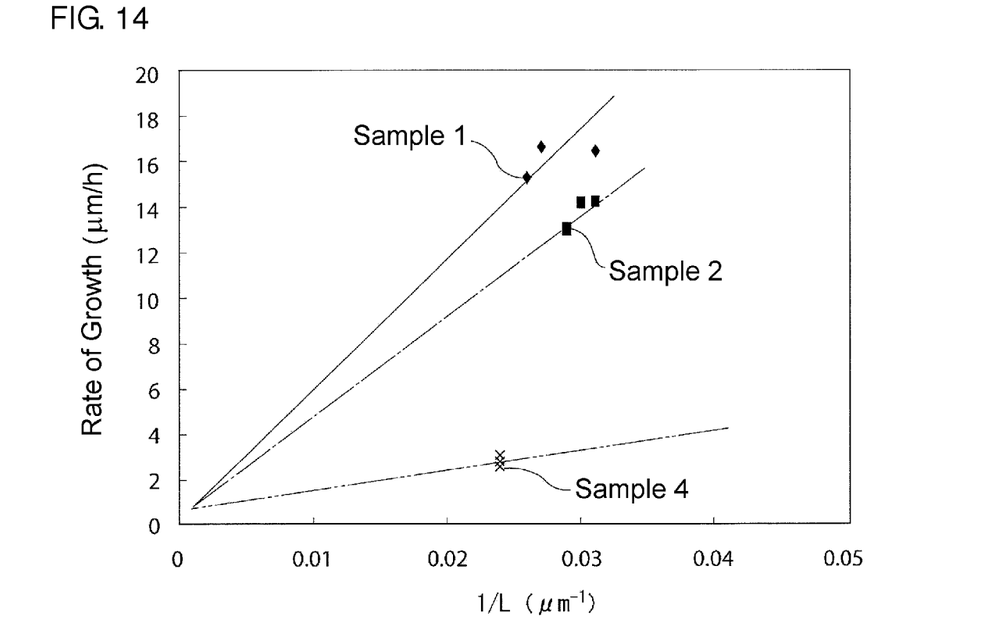
FIG. 14 is a graph showing the rates of growth of monocrystalline silicon carbide epitaxial growth films in Samples 1, 2, and 4.
Figure 15:
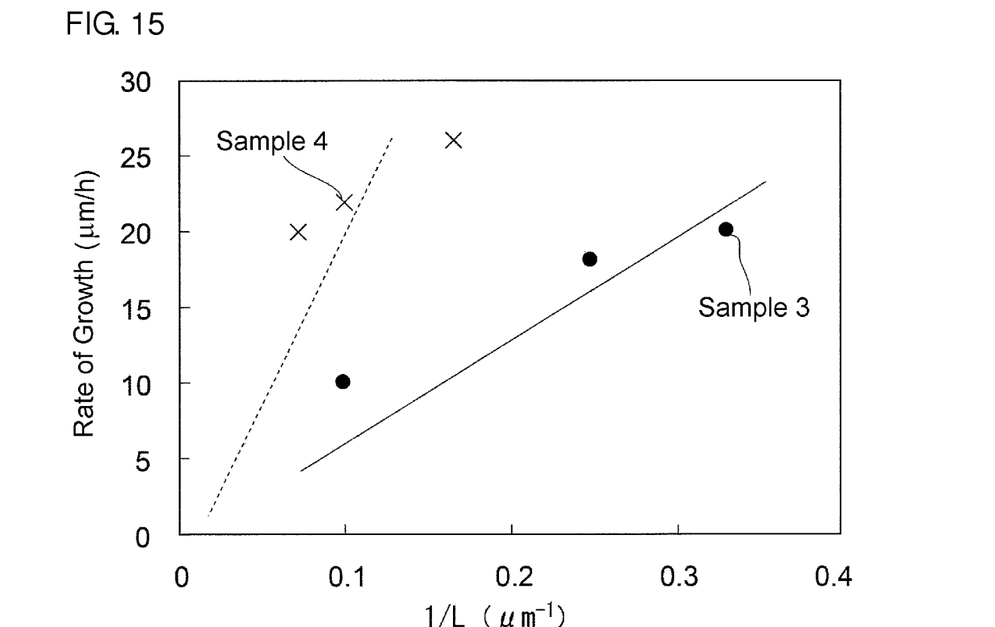
FIG. 15 is a graph showing the rates of growth of monocrystalline silicon carbide epitaxial growth films in Samples 3 and 4.

The results are shown in FIGS. 14 and 15. In FIGS. 14 and 15, the ordinate represents the rate of growth of each monocrystalline silicon carbide epitaxial growth film 20 and the abscissa represents the reciprocal (1/L) of the thickness (L) of the silicon melt layer 13.

As seen from the results shown in FIGS. 14 and 15, in the case of using Samples 1 and 2 in which when the polycrystalline silicon carbide film 11c forming the surface layer of the feed substrate 11 was subjected to X-ray diffraction, not only a diffraction peak corresponding to the (111) crystal plane but also diffraction peaks other than the diffraction peak corresponding to the (111) crystal plane were observed as diffraction peaks corresponding to a crystal polymorph of polycrystalline 3C—SiC, the rate of growth of the monocrystalline silicon carbide epitaxial growth film 20 was high. On the other hand, in the case of using Samples 3 and 4 in which when the polycrystalline silicon carbide film 11c forming the surface layer of the feed substrate 11 was subjected to X-ray diffraction, only diffraction peaks corresponding to the (111) crystal plane were observed as diffraction peaks corresponding to a crystal polymorph of polycrystalline 3C—SiC and, besides the first-order diffraction peak corresponding to the (111) crystal plane, no first-order diffraction peak having an intensity of 10% or more of the intensity of the first-order diffraction peak corresponding to the (111) crystal plane was observed, the rate of growth of the monocrystalline silicon carbide epitaxial growth film 20 was low. This shows that Samples 3 and 4 are less likely to cause the elution into the silicon melt layer 13.

(Measurement Conditions of Rate of Growth of Monocrystalline Silicon Carbide Epitaxial Growth Film 20)

Seed substrate: a silicon carbide substrate with a 4H crystal polymorph,

Pressure of Atmosphere: $10^{-6}$ to $10^{-4}$ Pa, and

Temperature of Atmosphere: 1900° C.

EXAMPLE

Figure 16:
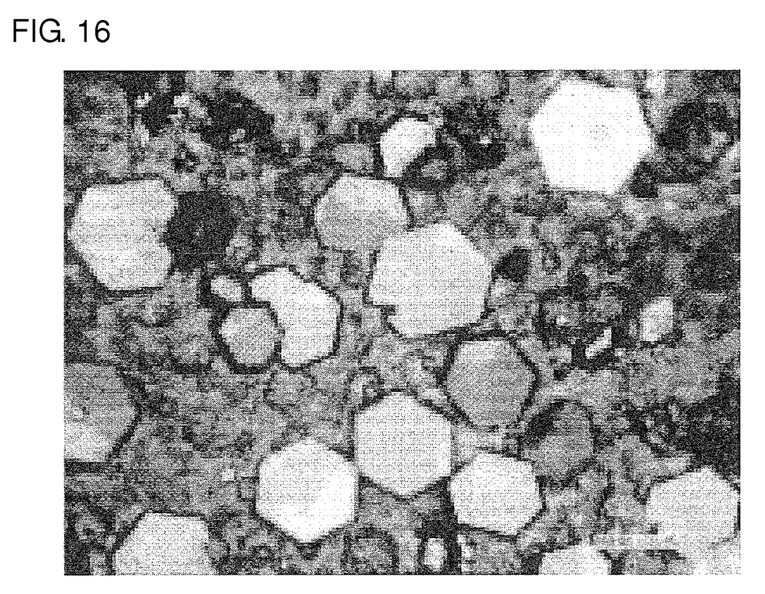
FIG. 16 is a SEM photograph of a seed substrate (Sample 3) after being subjected to an experiment of liquid phase epitaxial growth in an example.

Using the above produced Sample 1 as the feed substrate 11 and the above produced Sample 3 as the seed substrate 12, an experiment of liquid phase epitaxial growth of a monocrystalline silicon carbide was conducted under the same conditions as in the above experiment for evaluation of rate of growth. Thereafter, a photograph of the surface of Sample 3 serving as the seed substrate 12 was taken with a scanning electron microscope (SEM). The SEM photograph of the surface of Sample 3 is shown in FIG. 16. The photograph shown in FIG. 16 reveals that a hexagonal monocrystalline silicon carbide epitaxial growth film can be obtained by using as the feed substrate 11 Sample 1 or 2 in which upon X-ray diffraction of the surface layer of the feed substrate 11 not only a diffraction peak corresponding to the (111) crystal plane but also diffraction peaks other than the diffraction peak corresponding to the (111) crystal plane are observed as diffraction peaks corresponding to a crystal polymorph of polycrystalline 3C—SiC and using as the seed substrate 12 Sample 3 in which upon X-ray diffraction of the surface layer of the seed substrate 12 a first-order diffraction peak corresponding to the (111) crystal plane is observed as a first-order diffraction peak corresponding to a crystal polymorph of polycrystalline 3C—SiC but no other first-order diffraction peak having a diffraction intensity of 10% or more of the diffraction intensity of the first-order diffraction peak corresponding to the (111) crystal plane is observed.

COMPARATIVE EXAMPLE

Figure 17:
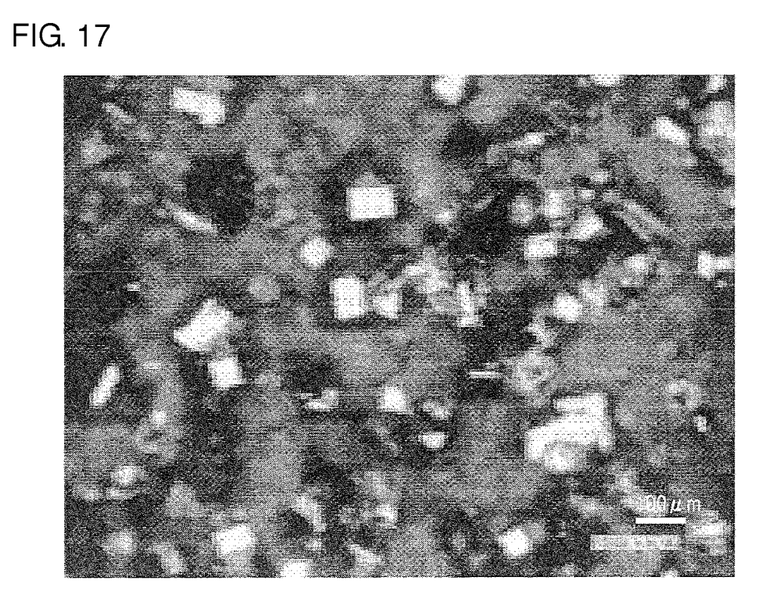
FIG. 17 is a SEM photograph of a seed substrate (Sample 2) after being subjected to an experiment of liquid phase epitaxial growth in a comparative example.

Using the above produced Sample 1 as a feed substrate and the above produced Sample 2 as a seed substrate, an experiment of liquid phase epitaxial growth of a monocrystalline silicon carbide was conducted under the same conditions as in the above experiment for evaluation of rate of growth. Thereafter, a photograph of the surface of Sample 2 serving as the seed substrate was taken with a scanning electron microscope (SEM). The SEM photograph of the surface of Sample 2 is shown in FIG. 17. The photograph shown in FIG. 17 reveals that in the case of using as a seed substrate Sample 2 in which upon X-ray diffraction of a polycrystalline silicon carbide film a first-order diffraction peak corresponding to the (111) crystal plane is observed as a diffraction peak corresponding to a crystal polymorph of polycrystalline 3C—SiC but no other first-order diffraction peak having a diffraction intensity of 10% or more of the diffraction intensity of the first-order diffraction peak corresponding to the (111) crystal plane is observed, epitaxial growth hardly progresses and no suitable hexagonal monocrystalline silicon carbide epitaxial growth film can be obtained.

REFERENCE SIGNS LIST

10 . . . vessel
11 . . . feed substrate
11a . . . principal surface
11b . . . support member
11c . . . polycrystalline silicon carbide film
12 . . . seed substrate
12a . . . principal surface
12b . . . support member
12b . . . polycrystalline silicon carbide film
13 . . . silicon melt layer
14 . . . unit for liquid phase epitaxial growth of a monocrystalline silicon carbide
20 . . . monocrystalline silicon carbide epitaxial growth film

The invention claimed is:

1. A unit for liquid phase epitaxial growth of a monocrystalline silicon carbide, the unit comprising a seed material and a feed material, wherein
the feed material includes a surface layer containing a polycrystalline silicon carbide with a 3C crystal polymorph and is such that upon X-ray diffraction of the surface layer a diffraction peak corresponding to a (111) crystal plane and a diffraction peak other than the diffraction peak corresponding to the (111) crystal plane are observed as diffraction peaks corresponding to the polycrystalline silicon carbide with a 3C crystal polymorph,
the seed material includes a surface layer containing a polycrystalline silicon carbide with a 3C crystal polymorph is such that upon X-ray diffraction of the surface layer a first-order diffraction peak corresponding to a (111) crystal plane is observed as a diffraction peak corresponding to the polycrystalline silicon carbide with a 3C crystal polymorph but no other first-order diffraction peak having a diffraction intensity of 10% or more of the diffraction intensity of the first-order diffraction peak corresponding to the (111) crystal plane is observed, and
the seed material and the feed material are heated in a position facing each other with a silicon melt layer therebetween to form a concentration gradient of graphite melting in the silicon melt layer and the monocrystalline silicon carbide is epitaxially grown on the seed material using the concentration gradient.

2. The unit for liquid phase epitaxial growth of a monocrystalline silicon carbide according to claim 1, wherein the first-order diffraction peak corresponding to the (111) crystal plane upon X-ray diffraction of the surface layer of the feed material is a main diffraction peak having the highest diffraction intensity among first-order diffraction peaks corresponding to the polycrystalline silicon carbide with a 3C crystal polymorph.

3. The unit for liquid phase epitaxial growth of a monocrystalline silicon carbide according to claim 1, wherein the diffraction peak observed upon X-ray diffraction of the surface layer of the feed material and other than the diffraction peak corresponding to the (111) crystal plane includes at least one diffraction peak, each corresponding to one of a (200) crystal plane, a (220) crystal plane, and a (311) crystal plane.

4. The unit for liquid phase epitaxial growth of a monocrystalline silicon carbide according to claim 3, wherein the diffraction peak observed upon X-ray diffraction of the surface layer of the feed material and other than the diffraction peak corresponding to the (111) crystal plane includes diffraction peaks, each corresponding to one of the (200) crystal plane, the (220) crystal plane, and the (311) crystal plane.

5. The unit for liquid phase epitaxial growth of a monocrystalline silicon carbide according to claim 1, wherein the sum of the intensities of first-order diffraction peaks other than the first-order diffraction peak corresponding to the (111) crystal plane upon X-ray diffraction of the surface layer of the feed material is 10% or more of the sum of the intensities of all the first-order diffraction peaks.

6. The unit for liquid phase epitaxial growth of a monocrystalline silicon carbide according to claim 1, wherein
each of the feed material and the seed material includes a surface layer containing a polycrystalline silicon carbide with a 3C crystal polymorph and is such that upon X-ray diffraction of the surface layer at least one first-order diffraction peak is observed, each first-order diffraction peak corresponding to one of a (111) crystal plane, a (200) crystal plane, a (220) crystal plane, and a (311) crystal plane, and
the average crystallite diameter calculated from the at least one first-order diffraction peak of the feed material is smaller than that calculated from the at least one first-order diffraction peak of the seed material.

7. The unit for liquid phase epitaxial growth of a monocrystalline silicon carbide according to claim 6, wherein the average crystallite diameter calculated from the first-order diffraction peak observed upon X-ray diffraction of the surface layer of the feed material and corresponding to the polycrystalline silicon carbide with a 3C crystal polymorph is 700 Å or less.

8. The unit for liquid phase epitaxial growth of a monocrystalline silicon carbide according to claim 7, wherein
upon X-ray diffraction of the surface layer of the feed material a first-order diffraction peak corresponding to the (111) crystal plane and at least one first-order diffraction peak each corresponding to one of the (200) crystal plane, the (220) crystal plane, and the (311) crystal plane are observed, and
$(I_1/I_0)^{-1} \cdot D^2$ is equal to or smaller than $10^8$,
where:
$I_0$ represents the sum of the intensity of the first-order diffraction peak corresponding to the (111) crystal plane and the total intensity of the at least one first-order diffraction peak each corresponding to one of the (200) crystal plane, the (220) crystal plane, and the (311) crystal plane;
$I_1$ represents the total intensity of the at least one first-order diffraction peak each corresponding to one of the (200) crystal plane, the (220) crystal plane, and the (311) crystal plane; and
D represents the average crystallite diameter calculated from the at least one first-order diffraction peak each corresponding to one of the (200) crystal plane, the (220) crystal plane, and the (311) crystal plane.

9. The unit for liquid phase epitaxial growth of a monocrystalline silicon carbide according to claim 6, wherein the average crystallite diameter calculated from the first-order diffraction peak observed upon X-ray diffraction of the surface layer of the seed material and corresponding to the polycrystalline silicon carbide with a 3C crystal polymorph is more than 700 Å.

10. The unit for liquid phase epitaxial growth of a monocrystalline silicon carbide according to claim 1, wherein the feed material is smaller than the seed material in terms of proportion of (111) crystal planes having an orientation angle of 67.5° or more in the (111) crystal planes observed by X-ray diffraction of the surface layer.

11. The unit for liquid phase epitaxial growth of a monocrystalline silicon carbide according to claim 10, wherein the proportion of (111) crystal planes having an orientation angle of 67.5° or more in the (111) crystal planes observed by X-ray diffraction of the surface layer of the feed material is less than 80%.

12. The unit for liquid phase epitaxial growth of a monocrystalline silicon carbide according to claim 10, wherein the proportion of (111) crystal planes having an orientation angle of 67.5° or more in the (111) crystal planes observed by X-ray diffraction of the surface layer of the seed material is 80% or more.

13. The unit for liquid phase epitaxial growth of a monocrystalline silicon carbide according to claim 1, wherein an LO peak derived from a polycrystalline silicon carbide with a 3C crystal polymorph is observed upon Raman spectroscopic analysis of each of the surface layers of the feed material and the seed material with an excitation wavelength of 532 nm, and the feed material is smaller than the seed material in terms of absolute amount of shift of the LO peak from 972 $cm^{-1}$.

14. The unit for liquid phase epitaxial growth of a monocrystalline silicon carbide according to claim 13, wherein the absolute amount of shift of the LO peak from 972 $cm^{-1}$ in the feed material is less than 4 $cm^{-1}$.

15. The unit for liquid phase epitaxial growth of a monocrystalline silicon carbide according to claim 13, wherein the absolute amount of shift of the LO peak from 972 $cm^{-1}$ in the seed material is 4 $cm^{-1}$ or more.

16. The unit for liquid phase epitaxial growth of a monocrystalline silicon carbide according to claim 13, wherein the full width at half-maximum of the LO peak in the feed material is 7 $cm^{-1}$ or more.

17. The unit for liquid phase epitaxial growth of a monocrystalline silicon carbide according to claim 13, wherein the full width at half-maximum of the LO peak in the seed material is 15 $cm^{-1}$ or less.

18. The unit for liquid phase epitaxial growth of a monocrystalline silicon carbide according to claim 1, wherein the surface layer of at least one of the feed material and the seed material contains a polycrystalline silicon carbide with a 3C crystal polymorph as a major ingredient.

19. The unit for liquid phase epitaxial growth of a monocrystalline silicon carbide according to claim 18, wherein the surface layer of at least one of the feed material and the seed material is substantially made of the polycrystalline silicon carbide with a 3C crystal polymorph.

20. The unit for liquid phase epitaxial growth of a monocrystalline silicon carbide according to claim 1, wherein at least one of the feed material and the seed material includes a support member and a polycrystalline silicon carbide film formed on the support member and forming the surface layer.

21. The unit for liquid phase epitaxial growth of a monocrystalline silicon carbide according to claim 20, wherein the polycrystalline silicon carbide film has a thickness within a range of 30 μm to 800 μm.

22. The unit for liquid phase epitaxial growth of a monocrystalline silicon carbide according to claim 1, wherein at least one of the feed material and the seed material is formed of a polycrystalline silicon carbide material containing a polycrystalline silicon carbide with a 3C crystal polymorph.

* * * * *